(12) United States Patent
Blanchet et al.

(10) Patent No.: US 7,560,950 B2
(45) Date of Patent: Jul. 14, 2009

(54) PACKAGING RELIABILITY SUPERCHIPS

(75) Inventors: Jason E. Blanchet, Jericho, VT (US);
James V. Crain, Jr., Milton, VT (US);
Charles W. Griffin, Jericho, VT (US);
David B. Stone, Jericho, VT (US);
Robert F. White, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 12 days.

(21) Appl. No.: 11/954,589

(22) Filed: Dec. 12, 2007

(65) Prior Publication Data

US 2008/0088335 A1    Apr. 17, 2008

Related U.S. Application Data

(63) Continuation of application No. 11/491,216, filed on Jul. 21, 2006, now Pat. No. 7,348,792, which is a continuation of application No. 11/159,913, filed on Jun. 23, 2005, now Pat. No. 7,102,377.

(51) Int. Cl.
*G01R 31/02* (2006.01)
*G01R 31/26* (2006.01)

(52) U.S. Cl. ..................... 324/765; 324/760

(58) Field of Classification Search ................. 324/715, 324/760
See application file for complete search history.

(56) References Cited

U.S. PATENT DOCUMENTS

| | | | |
|---|---|---|---|
| 3,983,479 A | 9/1976 | Lee et al. ................. 324/158 R |
| 4,374,316 A * | 2/1983 | Inamori et al. .............. 219/209 |
| 5,489,851 A * | 2/1996 | Heumann et al. ........... 324/537 |
| 5,497,076 A * | 3/1996 | Kuo et al. ................ 324/158.1 |
| 5,500,603 A | 3/1996 | Le .............................. 324/751 |
| 5,936,260 A | 8/1999 | Corbett et al. ................ 257/48 |
| 6,064,219 A | 5/2000 | Aigner ........................ 324/763 |
| 6,466,038 B1 * | 10/2002 | Pekin et al. .................. 324/719 |
| 6,538,264 B2 | 3/2003 | Corbett et al. ................ 257/48 |
| 6,541,736 B1 * | 4/2003 | Huang et al. ................ 219/209 |
| 6,577,149 B2 | 6/2003 | Doong et al. ................ 324/765 |
| 6,933,730 B2 * | 8/2005 | Parker et al. ................ 324/538 |
| 7,004,243 B1 * | 2/2006 | Babcock et al. ............. 165/185 |
| 7,348,792 B2 * | 3/2008 | Blanchet et al. ............. 324/765 |
| 2002/0024046 A1 | 2/2002 | Corbett et al. ................ 257/48 |
| 2003/0151047 A1 | 8/2003 | Corbett et al. ................ 257/48 |

* cited by examiner

*Primary Examiner*—Ha T. Nguyen
*Assistant Examiner*—Roberto Velez
(74) *Attorney, Agent, or Firm*—John A. Jordan; William H. Steinberg

(57) ABSTRACT

A test chip module for testing the integrity of the flp chip solder ball interconnections between chip and substrate. The interconnections, are thermally stressed through an array of individual heaters formed in a layer of chip metallurgy to provide a uniform and ubiquitous source of heat. Current is passed through the interconnection to be tested by a current supply circuit using one signal I/O interconnection and the voltage drop across the interconnection to be tested from the current passed therethrough is measured by a voltage measuring circuit connected through another signal I/O interconnection. Stress initiating cracking and degradation at the interconnection creates a measurable change in voltage drop across the interconnection.

1 Claim, 4 Drawing Sheets

PACKAGING RELIABILITY SUPERCHIPS

This application is a continuation application of U.S. patent application Ser. No. 11/491,216, filed Jul. 21, 2006 and issued as U.S. Pat. No. 7,348,792, which application is a continuation application of U.S. patent application Ser. No. 11/159,913, filed Jun. 23, 2005 and issued as U.S. Pat. No. 7,102,377.

BACKGROUND OR THE INVENTION

1. Field of the Invention

The present invention relates to semiconductor products reliability testing and, more particularly, to semiconductor reliability test chips for testing standard and ASIC semiconductor packages.

2. Background and Related Art

During the course of qualifying packages and modules, it is customary to run standard stresses to predict reliability of the packaged semiconductor products under field conditions. Typically, the reliability of the semiconductor packages is tested by subjecting them to a variety of life accelerating environments over a period of time until product failure or minimum requirements are met. The packages are then inspected and tested in an attempt to determine the cause of failure. Since there can be many reasons for failure, the analyses of the failure can be lengthy and difficult. Attempts have also been made to design semiconductor test chips to assess specific types of failure of the product.

For example, an article by J. S. Sweet, entitled "The Use of Special Purpose Assembly Test Chips for Evaluating Reliability In Packaged Devices", published by Sandie National Laboratory, pages 15-19, describes some of these types of chips. The article describes a series of individual special purpose assembly test chips to aid in assessing the reliability of packaged integrated circuits. The special purpose assembly test chips contain special purpose circuits or sensors which enhance the detection of failures or detect moisture, detect mobile ions, or other contaminants which can lead to failure of the semiconductor component.

Other special purpose test chips have been designed to aid in assessing the reliability of a variety of specific types of failures of semiconductor packages. For example the U.S. Pat. No. 6,538,264 to Corbett, el al. describes a test chip with a plurality of test functions, such as, bond pad pitch and size effects on chip design, wire bond placement accuracy, bond pad damage below the bond pad during bonding (cratering), street width effects, thermal impedance effects, ion mobility evaluation and chip on board in flip chip application test capabilities.

Test chips for flip-chip packages, such as described by Corbett, et al., using C4 solder ball technology have thus taken a variety of forms. The need to verify C4 integrity as part of the chip/package/interconnect qualification is an important product requirement. This requirement has become more important with the advent of organic C4 chip packages. In this regard, it has been found that certain product design features will result in early reliability stressing failures. Thus, to provide the most effective testing process, it is necessary to design the chip/package/interconnect qualification packages as closely to product as possible to avoid having to address, either failures in features that do not appear in the product or failure to stress features that do exist in the product that may ultimately fail. One of the major stresses that cause failures in organic flip chip packages is the thermal mismatch in CTF between the flip chips and organic substrate. Such thermal mismatch causes stress and, potentially, fatigue at the C4 interconnect initiating fracture and cracking of the C4 bonding, for example, resulting in connection failure. In this regard, it is known that this stress is proportional to the distance from neutral point (DNP) of a particular C4 solder ball connection.

One approach to stressing packages to test for fatigue leading to fracture and cracking of C4 connections due to thermal mismatch is to cyclically heat the packaged chip using electrically resistive heaters in the chip to simulate product thermal cycling. This can be accomplished by designing a test chip with a large resistive heater in the chip M1 metal layer. Such a heater is typically wired through a small number of C4 connections. With a small number of connections and with the need for increased heat and power, there is concern with the resistive heating of the relatively narrow package signal traces such as to potentially introduce excessive temperature induced failures that would not exist in the product. Alternatively, designing the package wires as heavy power supplies connected to signal C4 positions represents a nonstandard feature in the package that does not represent product.

A conventional approach to testing for the reliability and integrity of C4 interconnections between chip and substrate is to employ a continuity-type testing procedure. An example of such an approach is that employed by Corbett, et al. supra wherein metal wire stitch lines are employed to connect selected C4 pads on the chip together and substrate or board level wiring is used to connect all wiring in a daisy chain approach. Thus, the resulting structure has a concatenation of board wire, package wire, chip wire, board wire, etc. While this approach has the advantage of allowing a large number of connections to be tested with one circuit, it has the disadvantage that should there be fatigue or fracture in one of the interconnections being monitored causing a change in resistance, for example, such change can easily be lost in the larger overall resistance of the single circuit interconnecting all of the interconnects.

In this regard, it is known that small changes in resistance are indicative of C4 fatigue and crack initiation. Accordingly, it is advantageous to test for fatigue and crack initiation using a low resistance circuit-approach such as to allow easy and ready identification of the connection exhibiting fatigue and snack initiation.

A further limitation of prior art approaches is that the array of pads on the test chip used for testing covers a small area of the chip, and the array of pads is typically near the center of the chip thus discounting the contribution to stress that would be expected for high DNP C4's.

Accordingly, the test chip should be made to replicate the product that it is representing as closely as possible. To this end, it is undesirable to wire out all of the C4 pads to the chip substrate or PCB. In this regard, most product chips require power connections that are handled via the power planes of the package. Thus, to maintain the mechanical properties of the package, it is advantageous to design the test package such that signal and power structures look like the product design. It should be noted that, the highest DNP C4's are typically power and ground connections, particularly in application specific footprints.

SUMMARY OF THE PRESENT INVENTION

In accordance with the present invention, a test chip is provided with a design to enable the creation of a test module that closely approximates the features of the product package being simulated. The test chip is interconnected to a first level package substrate, and sometimes a board, for reliability stressing.

To this end, the test chip has a regular array of function assigned C4 pads, akin to those of the product chip, which pads are imaged as one or more unit cells that are repeated over the entire array of C4 chip pads. Resistive heaters are distributed to cover all areas of the test chip. This is achieved by providing individual resistive line heaters at the M1 metal layer of the test chip covering the area of each cell. The heaters in each cell are connected to the standard voltage planes of the package substrate. The resistance of the heaters of the cells can be individually selected and tuned to the product chip features to be tested and power supply used for testing.

Some of the cells also includes bridge conductor arrangements connecting the various signal I/O C4 solder balls to power plane C4 solder balls for four point resistance measurements of line conductors and, in particular, C4 bonding interconnections. The resistance measurement is enabled by causing current to flow in a current supply circuit including some portions of line conductors and the C4 interconnection being tested, and then measuring the voltage across the tested portion of the circuit. The same process may be used for each product C4 interconnection. Of particular interest for testing are the C4 connections at the periphery of the chip (greatest DNP). Typically, such C4's are the power distribution C4's. The resistance measurement approach, in accordance with the present invention, allows for isolated low resistance measurements permitting easy identification of the C4 interconnection bonding exhibiting fatigue leading to crack initiation and failure.

Accordingly, it is an object of the present invention to provide an improved test chip package and method therefor.

It is a further object of the present invention to provide a test chip package having a design that closely approximates the design of the product chip package that the test is simulating.

It is yet a further object of the present invention to provide a test chip having an array of individual heaters distributed over the area of the test chip.

It is yet still a further object of the present invention to provide a test chip package that acts to test continuity of connections, such as C4 solder ball bonding connections, in a manner that allows ready identification of the location of conductor fatigue leading to crack initiation and failure.

It is another object of the present invention to provide a test chip that provides distributed heat stressing over the area of the clip and a simple four point measurement arrangement for identifying conductors and C4 interconnections experiencing fatigue, cracking and similar types of degradation leading to device failure.

DETAILED DESCRIPTION

Figure 1:
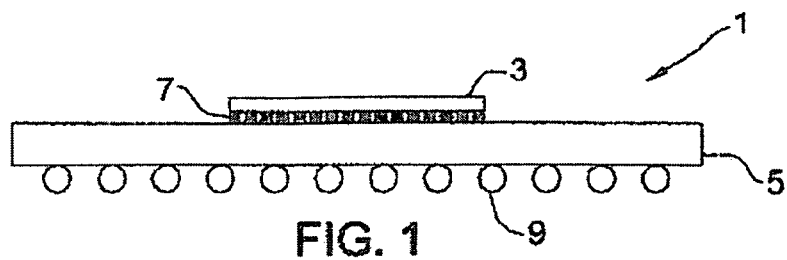
FIG. 1 shows a typical flip chip module.

With reference to FIG. 1, there is shown a general flip chip module 1 with flip clip 3 mounted on first level package substrate 5. Flip clip 3 has an array of C4 solder balls connected to pads (not shown) on substrate 5. BGA conductors 9 act to interconnect the module to the next level of packaging such as a PCB.

Figure 2A:
FIG. 2A shows an end view of the test flip chip of the present invention with a particular C4 solder ball array pattern.
Figure 2B:
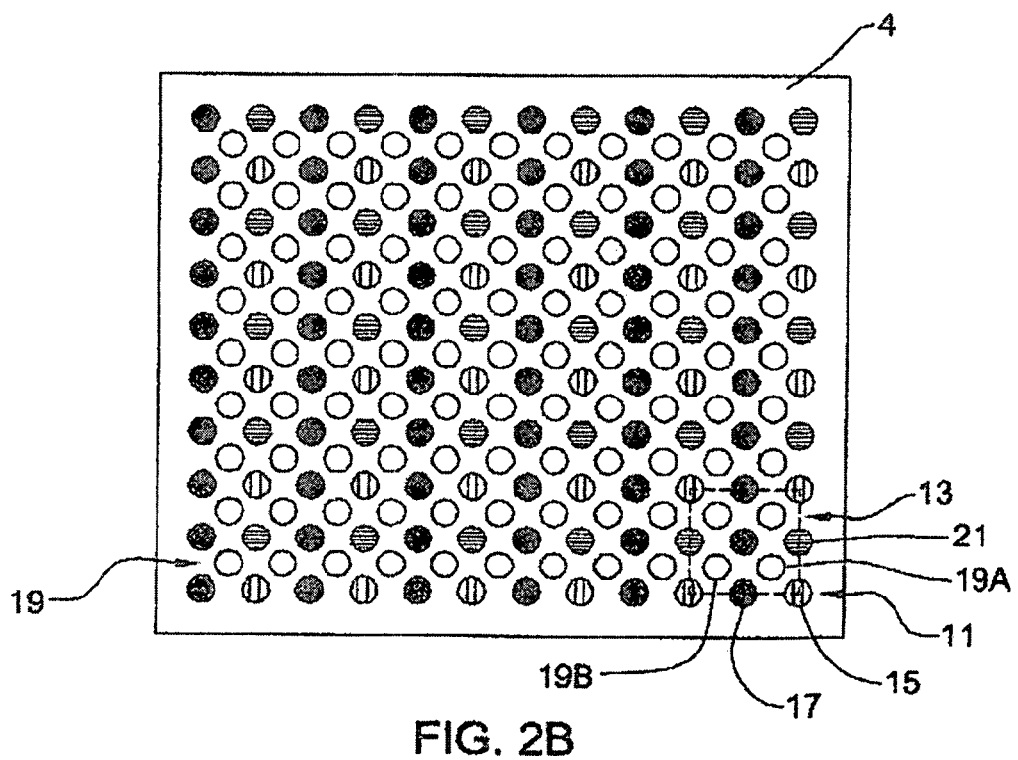
FIG. 2B shows a plan view of the test flip chip C4 solder ball array pattern of FIG. 2A.

FIG. 2A shows an end view of a test flip chip 4 in accordance with the present invention, enlarged to show a particular C4 solder ball pattern. Role line of C4 solder balls shown by arrow 11 in FIG. 2A depict the bottom row 11 of C4 solder balls shown in the planar view of FIG. 2B. To simplify description, the row of white signal solder balls, identified by arrow 19 in FIG. 2B, is not represented in FIG. 2A but can partially be seen in the enlarged end view of the test flip chip module in FIG. 3B. The dotted lines in FIG. 2B represent one of the unit cells 13 of an array of unit cells from which the full array is comprised. Thus, the unit cells repeat over the total array of solder balls, as exemplified by the several cells shown in FIGS. 5 and 6.

As further shown in FIG. 2B, the unit cells 13 encompass repeating patterns of function assigned C4 solder balls. For example, in unit cell 13, C4 solder ball 15 is assigned to the voltage Vdd I/O voltage function while C4 solder ball 17 is assigned to ground. Similarly, C4 solder ball 19A is assigned to the signal I/O function while C4 solder ball 21 is assigned to the Vdd power supply voltage function. As shown, each of the unit cells will have the same pattern of assigned function C4 solder balls. This can be seen more clearly in FIGS. 5 and 6.

As is evident from the above description and reference to FIG. 2B, different C4 solder ball cross hatching has been used to distinguish the different C4 solder ball assigned functions, with the C4 solder balls with no cross hatching (white) being assigned to the signal I/O function and the C4 solder balls of solid black assigned to ground. The regular cell patterns of assigned signal, power and ground C4 pads with solder balls, repeated over the surface of the chip, are employed for design convenience.

Figure 3A:
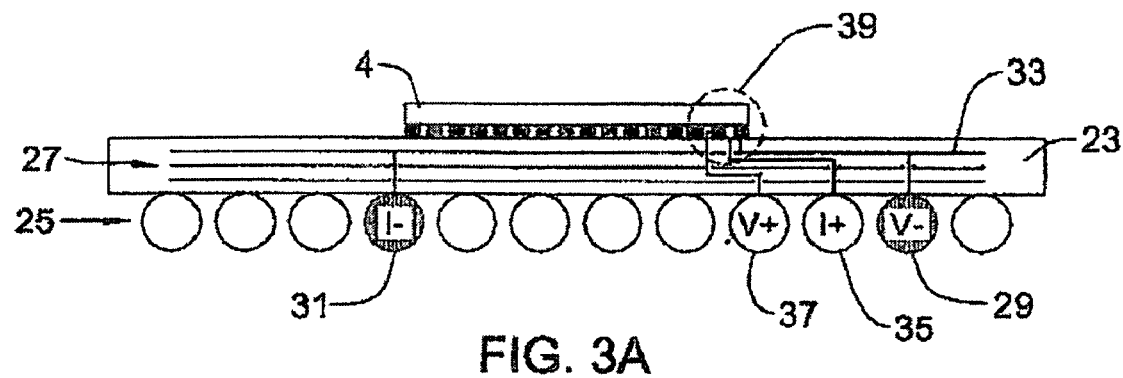
FIG. 3A shows a test flip chip module using the test flip chip of FIG. 2A-B, as mounted on a substrate having ball grid array (BGA) connections to flip chip C4 solder balls, in accordance with the present invention.

FIG. 3A shows test chip 4 mounted on a first level package substrate to form a test module. The first level package substrate 23 has an array 25 of BGA's across its bottom surface for connection to the next level of packaging. The C4 solder balls of test chip 4 are respectively soldered to pads (not shown) of an array of pads on the top surface of first level package substrate 23 using conventional product assembly processes. Product qualification requires that the integrity of the interconnection bond of solder balls to pads be tested after being stressed. It is known that stressing may cause fatigue and degration of the C4 interconnection which, in turn, causes an increase in resistance across the interconnection. However, small increases in resistance can be lost in the noise where several C4 solder ball interconnections are being tested serially together thereby masking the onset of failure of the fatigued C4 solder ball interconnection. It is also much harder to isolate a failure identified in a long test chain.

To overcome this problem, a sensitive four point resistance measurement across individual C4 interconnections is undertaken with little extraneous resistance introduced. FIG. 3A shows three power distribution planes 27 in first level package 23. Typically, such planes are assigned to Vdd, Vdd I/O and ground. Selected BGA's of the BG array 25 are assigned to selected power distribution planes 27. As shown in FIG. 3A, BGA's 29 and 31 are assigned to Vdd I/O power plane 33 function, as shown by the conductors connected thereto. BGA's 35 and 37 are assigned to the signal I/O function and thus are connected through the first level package to signal I/O C4 solder ball interconnections.

Figure 3B:
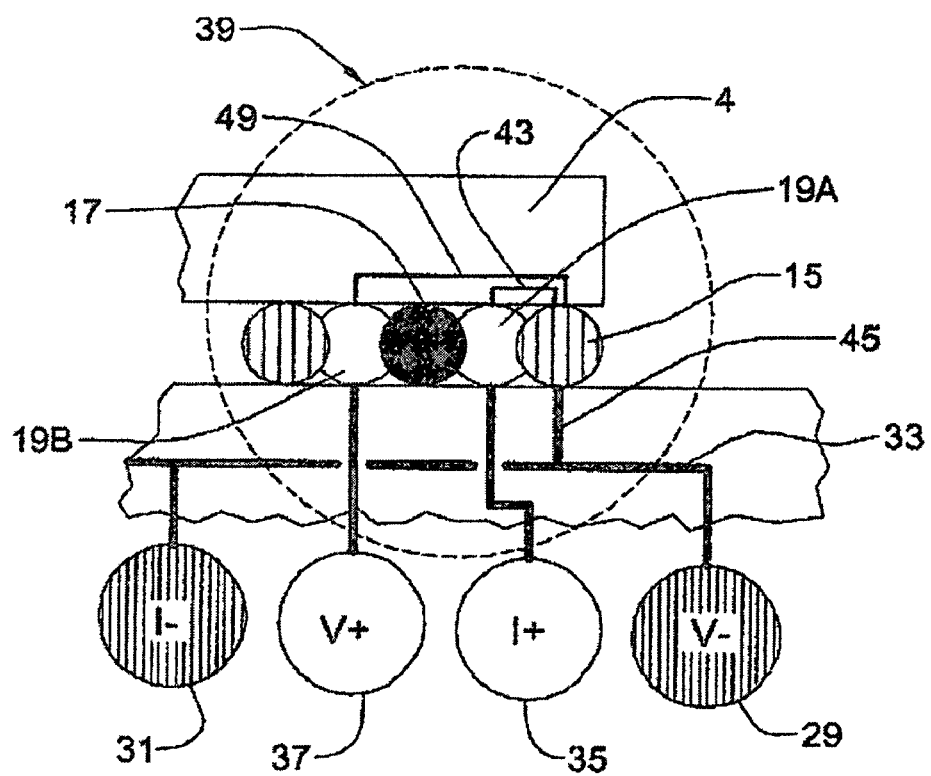
FIG. 3B shows an enlargement of the BGA and C4 solder ball interconnections for a portion of the flip chip module, in accordance with the present invention.

A low resistance circuit for four point resistance measurement across a selected C4 interconnection is achieved by applying a current source between signal I/O BGA 35 and Vdd I/O BGA 31 and then measuring resistance across signal I/O BGA 37 and Vdd I/O BGA 29. The effective four point resistance measurement will yield a small value for the resistance of a short conductive segment within the package including conductor 45 and the target C4 ball 15, as shown in FIG. 3B. Such small value of resistance (sub ohm) will increase, however, where applied stress causes fatigue and degradation of the C4 solder ball interconnection. The increase in resistance caused by fatigue and degradation may typically be around one half ohm but may also vary from this amount.

The manner in which the four point resistance measurement is taken will become more clear with reference to FIG. 3B which shows an enlarged segment of the test chip/first level package interconnection generally corresponding to portion 39 in FIG. 3A. As shown, signal I/O BGA's 35 and 37 are connected to sisal I/O C4 solder balls 19A and 19B, corresponding to the same identified signal I/O C4 solder balls in FIG. 2B. Similarly, Vdd I/O BGA's 29 and 31 are connected to Vdd I/O C4 solder ball 15 corresponding to the same identified Vdd I/O C4 solder ball in FIG. 2B, which is the solder ball interconnection to be tasted. Bridge conductors, diagramatically shown as conductors 43 and 49, act to electrically connect C4 solder ball 15 to signal I/O C4 solder balls 19A and 19D, as will be explained more fully hereinafter.

Figure 4:
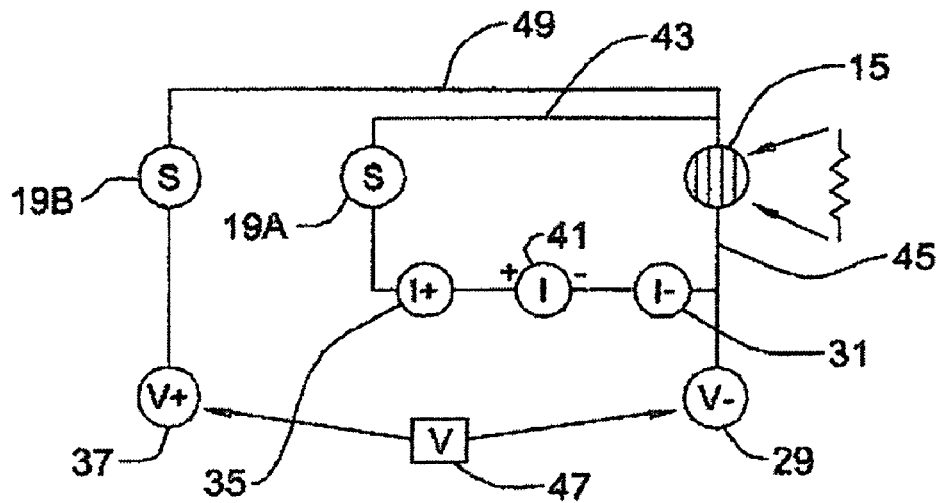
FIG. 4 shows an equivalent circuit of the BGA and C4 solder ball interconnections shown in FIGS. 3A and 3B.

FIG. 4 represents an equivalent circuit schematic for the circuit configurations of FIG. 3B. As shown, currant source 41 provides current flow through signal I/O BGA 35, signal I/O C4 solder ball 19A, conductor 43, Vdd I/O C4 solder ball 15, conductor 45 and Vdd I/O BGA 31 thereby forming a current supply circuit. Conductor 43 corresponds to the same numbered conductor in FIGS. 3B and 6 while conductor 45 corresponds to the same numbered conductor in FIG. 3B. Similarly, the V+ node 37 in FIG. 4 corresponds to the saline numbered V+ signal I/O BGA in FIG. 3B while the V− node 29 in FIG. 4 corresponds to the same numbered V− voltage Vdd I/O BGA in FIG. 3B.

A voltage measurement across C4 solder ball 15 and conductor 45 is taken by voltage measuring device 47. Since there is negligible current flow for such voltage measurement, there is negligible voltage drop in the voltage measurement circuit wire conductors except where conductors are shared with the flowing current, i.e., C4 solder ball 15 and conductor 45. Where the integrity of the C4 solder ball interconnection 15 and conductor 45 is not affected by thermal stressing they exhibit negligible resistance change as measured by voltage measuring device 47. However, where thermal stressing causes fatigue initiating degradation and cracking of the C4 interconnection 15, a small resistance change would be measured, as symbolically shown.

It should be noted that, the measurable parameter in determining whether thermal stressing causes fatigue initiating degradation and cracking of the C4 solder ball interconnection is resistance change. Thus, even where the current supply circuit exhibits a normal amount of known resistance due to standard circuit conditions, a change in resistance in the circuit, as determined by a change in measured voltage, would indicate interconnection fatigue initiating degradation and cracking of the C4 solder ball interconnection.

Although FIGS. 3 and 4 describe a four point resistance measurement across C4 solder ball interconnection 15, it is clear that the same process may be used for other C4 solder ball interconnections. However, it is understood that thermal stressing has the greatest impact at the edges of the chip, i.e., C4 solder ball locations with the greatest DNP. This is particularly true for corner locations which have the maximum DNP. As shown in FIG. 2B, the outer edge C4 solder balls around the perimeter of test chip 4 are assigned to power distribution. Thus, it is the power distribution C4 solder balls that are most susceptible to failure. Accordingly, the test chip package arrangement of FIG. 3 allows package and chip interconnections to be tested in a mechanical environment as much like the product as possible. The power plane structure used on product is maintained on the test vehicle.

Figure 5:
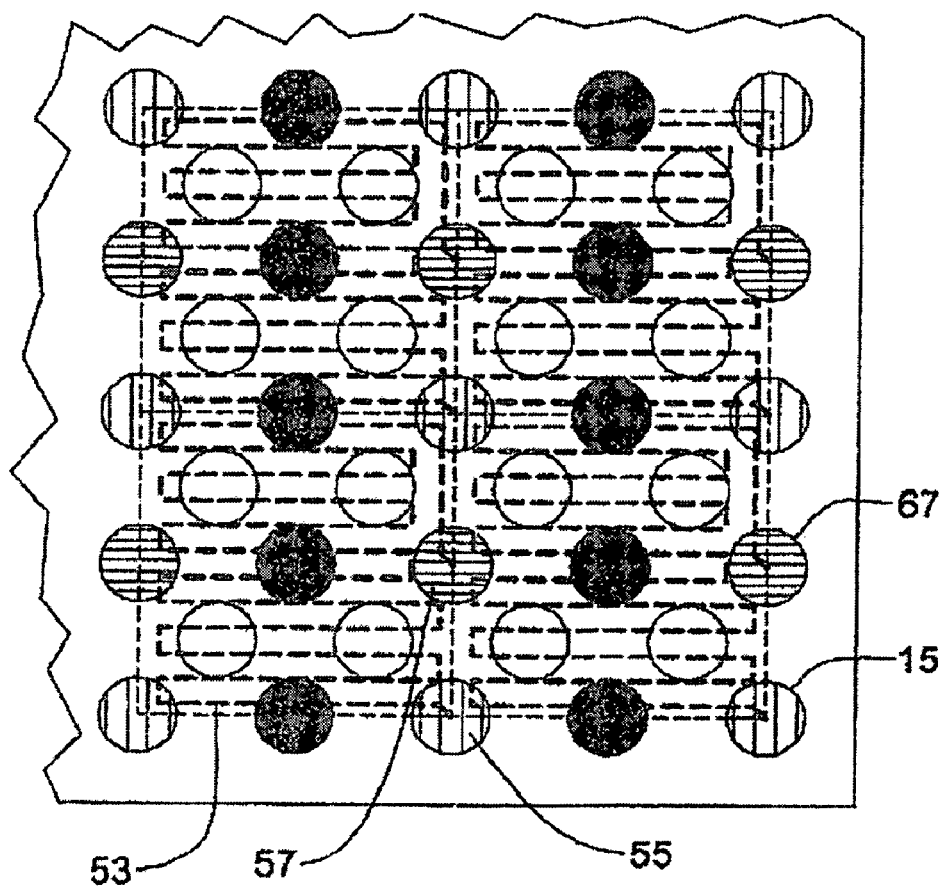
FIG. 5 shows a plan view of a portion of the flip chip of FIG. 2A-B with the distributed wire resistance heater arrangement, in accordance with the present invention.
Figure 6:
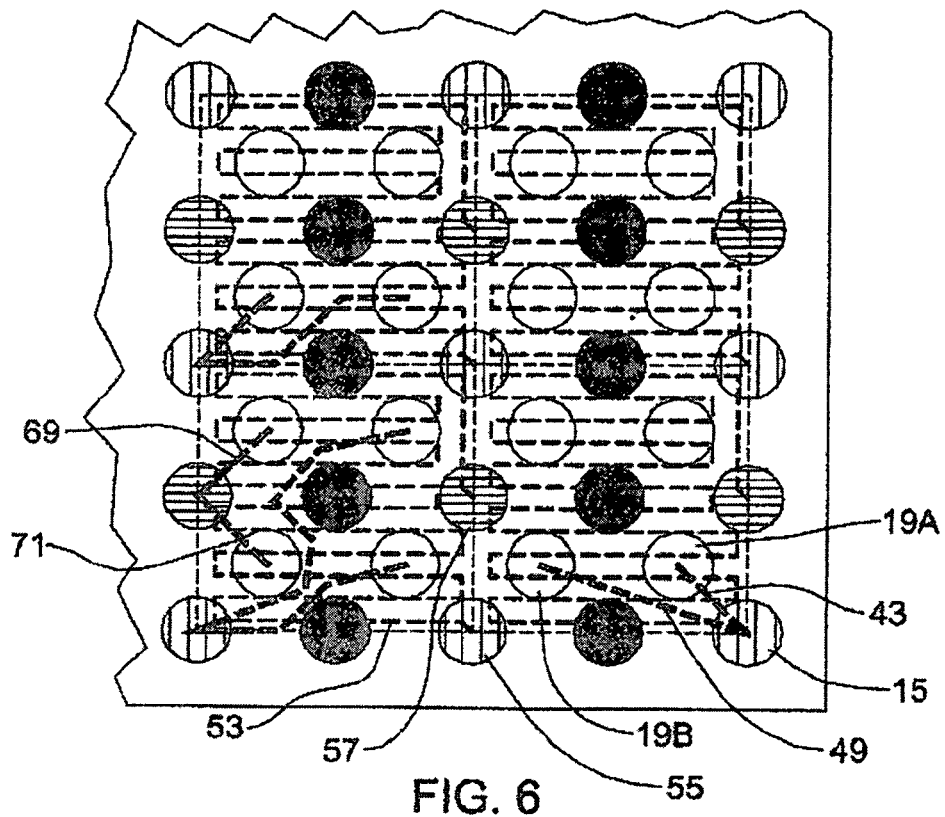
FIG. 6 shows the plan top view of a portion of the flip chip with distributed wire resistance heater arrangement as shown in FIG. 5 with the addition of wire bridge connections used in the four point voltage measurement across C4 interconnections.

FIG. 5 shows a planar view of the distributed heater arrangement (in broken line.) for thermally stressing the test chip, in accordance with the present invention. FIG. 6 shows the same planar view with four point measurement bridge conductors, such as conductors 43 and 49 (in broken lines) used to make the four point resistance measurement across C4 solder ball 15. It is clear that other conductors may be included to permit the four point resistance measurement to be made across other C4 solder ball interconnections, some of which conductors are shown at the lower left of FIG. 6, such as conductors 69 and 71, for example. FIG. 6 demonstrates that the four point resistance measurement bridge conductor structure allows the measurement to be made with the test chip under thermal stress.

Figure 7:
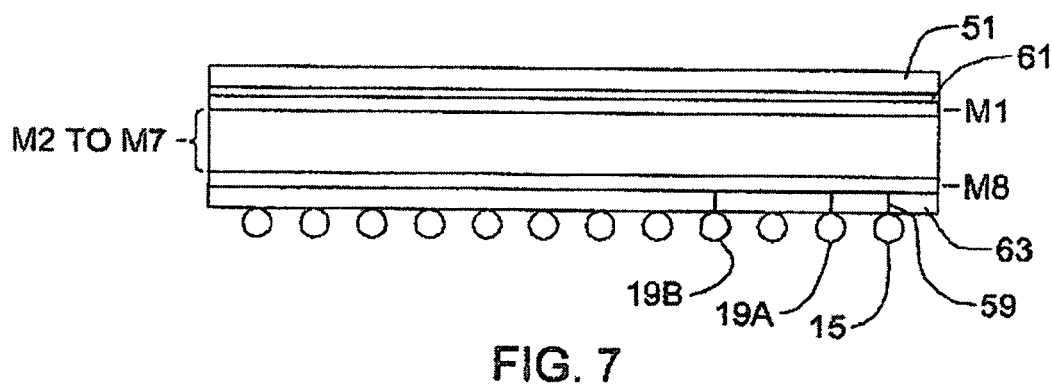
FIG. 7 shows a cross-sectional view of the test flip chip of FIG. 2A-B to depict the manner in which resistance heater and bridge connections may be made.

FIG. 7 depicts a cross-sectional view of the chip to show how the structure for the resistive heaters and four point measurement conductor may be fabricated. Product chips typically have 6 to 8 layers of metallurgy separated by insulating layers, designated, for example, M1 to M8 in FIG. 7, as deposited upon silicon layer 51. As shown in FIG. 7, C4 solder ball 15 is connected by a conductive via 59 through insulating layer 63 to M8 metal layer which layer, in turn, connects C4 solder ball 15, by conductive line traces and conductive vias, to signal I/O C4 solder balls 19A and 19B. These conductive line traces are similarly depicted as bridge conductors 43 and 49 in FIGS. 3B, 4 and 6. The conductive line traces may be made of aluminum or copper, for example, and have a width of from 1 micron to 75 micron. It should be understood that the layers of metallurgy and insulation shown in FIG. 7 are not to scale but are shown merely as an aid to understanding how the test chip package, in accordance with the present invention, may be implemented.

In similar manner, metal layer M1 on insulating layer 61 may be patterned to form resistive heater line traces in a serpentine configuration, as shown in FIGS. 5 and 6. Other heater configuration may also be used as long as the pattern generally covers the area of the cell. As shown in FIGS. 5 and 6, each cell has its own serpentine shape resistive heater and the pattern of cells with heater repeat over the area of the test chip. The opposing ends of the resistive heater line traces of the M1 metal layer of FIG. 7 are connected by conductive vias (not shown) to different power distribution C4 solder balls. As shown in FIGS. 5 and 6, for example, resistive heater line trace 53 is connected at one end to Vdd I/O C4 solder ball 55, as shown by the slight bend in the line trace, and at the other end to Vdd C4 solder ball 57. This same connection configuration is carried out over the entire test chip, as shown for example by the resistive heater connections between C4 solder balls 15 and 67. However, other connection configurations to power the resistive heaters are clearly possible.

It should be noted that as configured, the resistive heater line traces of each cell are in parallel with one another. Thus, in determining the resistance required for the desired heat generation, the parallel resistance must be considered and tuned to the power supply employed for maximum power distribution. For example, where net resistance of 12 ohms is the design choice, the resistance of the respective line traces is selected to give an overall parallel resistance of 12 ohms. In this regard, resistive heater line traces may typically be made of copper with a line width of 10 microns to submicrons depending upon the test chip requirements.

The distribution of heat over the entire chip area rather than using localized heating has the advantage of spreading out the current required in smaller amounts over more heaters, and more C4s opposed to the use of the larger current density per C4 required for localized heating structures.

For organic flip chip modules, failure mechanisms are often related to specific geometries in the package being stressed. To avoid stressing geometries that are test vehicle specific, the power for the heaters is, in accordance with the present invention, brought in on the power planes, as described above. The distribution of heat via an array of individual heaters energized via power planes avoids the overheating that may occur in schemes where the power is brought in on signal lines using signal traces in the package. It also allows for a more complete and effective evaluation of the thermal dissipation capability of the test module.

The process for testing involves heating the test chip module by energizing the distributed array of resistive heaters through the module power planes to generate heat to the point of stressing the module to the point of the most adverse product conditions. The level of heat required to appropriately stress the module will also depend upon the particular product package being tested. Typically, for organic flip chip packages, heating to temperatures between 0 and 125° C. degrees would be sufficient. After heating, the power may then be removed and four point resistance measurements of identified C4 interconnects are then taken.

It should be understood, however, that the heater arrangement in accordance with the present invention, and four point resistance measurement arrangement in accordance with the present invention, may be used independent of one another, in addition to being used together. For example, in addition to reliability testing of the C4 interconnection, the heaters may be used for thermal evaluations and thermal reliability work. This would include evaluating thermal interface materials, heat sinks and the reliability of interfaces. Thus, the heater design of the present invention permits test modules to be created using the same chip design but with small modification that wire up different combinations of heaters for thermal evaluation. Thus, various patterns of local heating or total blanket heating is possible. It can be seen, then, that selected heaters may be energized while others are not or, alternatively, heater may be omitted from selected cells.

It will be understood from the foregoing description that various modifications and changes may be made it the preferred embodiment of the present invention without departing from its true spirit. It is intended that this description is for purposes of illustration only and should not be construed in a limiting sense. The scope of this invention should be limited only by the language of the following claims.

What is claimed is:

1. A method of testing the integrity of interconnection solder balls between chip and substrate, comprising:
   providing a distributed array of individual resistive heaters connected in parallel with one another through a pair of different power distribution planes in said substrate with said resistive heaters arranged in physical contact over respective surface areas of said chip to uniformly heat said chip with an associated resistive heater to stress each of said interconnection solder balls to be tested within said areas;
   heating said surface areas of said chip with its associated heater to cause stressed interconnection solder balls to be tested within said areas; and
   testing said stressed interconnection solder balls by measuring the voltage drop across individual ones of said stressed interconnection solder balls within said areas one at a time when heated.

* * * * *